United States Patent [19]
Engemann et al.

[11] Patent Number: 5,517,085
[45] Date of Patent: May 14, 1996

[54] APPARATUS INCLUDING RING-SHAPED RESONATORS FOR PRODUCING MICROWAVE PLASMAS

[75] Inventors: Jürgen Engemann, Fuhlrottstrasse 48, D-42119; Frank Werner, Wuppertal, all of Germany

[73] Assignee: Jurgen Engemann, Wuppertal, Germany

[21] Appl. No.: 142,667

[22] Filed: Oct. 25, 1993

[30] Foreign Application Priority Data

Oct. 23, 1992 [DE] Germany .............................. 42 35 914

[51] Int. Cl.⁶ .................................................. H05H 1/46
[52] U.S. Cl. .............................. 315/111.21; 315/111.41; 333/99 PL; 118/723 MW; 118/723 MA; 118/723 AN; 204/298.38
[58] Field of Search .......................... 315/111.01, 111.21, 315/111.41, 111.51; 118/723 MW, 723 MA, 723 AN; 204/298.37, 298.38; 156/345; 333/99 PL

[56] References Cited

U.S. PATENT DOCUMENTS

| | | | |
|---|---|---|---|
| 3,577,207 | 5/1971 | Kirjushin | 315/111.21 X |
| 4,810,938 | 3/1989 | Morsan et al. | 315/111.21 X |
| 4,844,007 | 7/1989 | Eikelboom | 118/723 MW |
| 5,063,330 | 11/1991 | Leprince et al. | 315/111.21 |
| 5,296,784 | 3/1994 | Creiseler et al. | 315/111.41 |

FOREIGN PATENT DOCUMENTS

| | | |
|---|---|---|
| 0398832 | 11/1990 | European Pat. Off. . |
| 0564359A1 | 10/1993 | European Pat. Off. . |
| 2583250 | 12/1986 | France . |
| 2668676A2 | 4/1992 | France . |
| 4113142A1 | 9/1992 | Germany . |
| 1187824 | 7/1989 | Japan . |
| 132798 | 5/1990 | Japan ........................ 315/111.21 |
| 3158471 | 7/1991 | Japan ........................ 204/298.38 |
| 4134900A1 | 5/1992 | Japan . |

OTHER PUBLICATIONS

Patent Abstract of Japan; 2–132798(A); "Plasma Generating Equipment And Ion Source Using It"; Aug. 9, 1990; vol. 14/No. 368.

Primary Examiner—Benny T. Lee
Attorney, Agent, or Firm—Herbert Dubno; Yuri kateshou

[57] ABSTRACT

A low-pressure high-density plasma is excited in a plasma chamber surrounded by a cylindrical inner wall of a ring-shaped waveguide resonator to which the microwave energy is fed by a coupling from a microwave generator. The output coupling of the microwave energy from the standing wave maintained in the waveguide resonator to the plasma chamber is effected through a multiplicity of equispaced slits whose spacing is one half or one waveguide wavelength and which extend parallel to the generatrices of the cylindrical inner wall of the ring-shaped waveguide resonator.

18 Claims, 4 Drawing Sheets

APPARATUS INCLUDING RING-SHAPED RESONATORS FOR PRODUCING MICROWAVE PLASMAS

FIELD OF THE INVENTION

The present invention relates to an apparatus for producing a microwave plasma.

BACKGROUND OF THE INVENTION

Chemically reactive low-pressure plasma processes have become standard in the coating and etching of semiconductor wafers. Apart from the use of such plasma for the machining of flat substrates, plasma processes can be used for the treatment of objects of complex shapes, for example, molded plastic products, fiber bundles and materials in the form of webs or strips. There are a number of processes and apparatuses available which serve for the plasma treatment of substrates of different shapes, purposes and materials.

DE 31 17 257 C2, for example, describes an apparatus for plasma deposition of thin films in which the microwave power is outputted from a rectangular waveguide through a coupling window of a dielectric material into a cylindrical resonance chamber which simultaneously serves as a plasma chamber. Apparatus of this type and those which use air-core coils or composites of permanent magnets around the plasma chamber for the purpose of generating the electron-cyclotron-resonance, produce a directed plasma beam which can be employed, for example, for disk-shaped substrates like the wafers described previously. Large substrates, however, can only be treated by movement of them in the plasma beam or with the simultaneous use of a plurality of such plasma sources.

In DE 40 38 091 A1, an apparatus is described for generating a controllable microwave field which enables the ignition of a plasma which is homogeneous over a relatively long path. This is achieved by outputting the microwave power through a row of preferably inductive coupling antennae from a rectangular or cylindrical resonator.

On the vacuum side, the antennae are in contact with the plasma and as a consequence, a contamination of the substrate with the antenna material cannot be avoided. While with this earlier apparatus the machinery of large-area substrates is possible, the apparatus does not solve the problem of treating with plasma a large-volume substrate from all sides.

The French patent document FR-A-2 112 733 describes an apparatus for uniform microwave power coupling into a cylindrical volume and in which a standing wave is generated in a cylinder formed with a slit antenna. The wave pattern can meander. The connection of a microwave generator with the antenna here can be realized only with a coaxial cable.

This limits the possibility of upscaling this type of microwave excitation of a plasma because, with such a cable, transferable power over long periods of time with stability cannot exceed several hundred watts.

In the European patent EP 0 209 469 A1, an apparatus for producing an electron-cyclotron-resonance plasma is described in which the inputting of the microwave power is effected by a multiplicity of antennas which are disposed on the wall of the plasma chamber. The plasma chamber is surrounded by permanent magnets which, in the vicinity of the antennas, produce electron- cyclotron-resonance regions. As a consequence of the ion sputtering, the antennas directly in the plasma constitute a source of metallic contamination. To avoid such contamination EP 0 402 282 A2 describes an apparatus in which shielding plates are provided between the antennas and the plasma and upon which the substrate material can be captured. The disadvantageous effect of sputtering or atomization of the antenna materials is thereby reduced, although it is not completely eliminated.

Both of these earlier systems have the common drawback with respect to the nature of the distribution of the microwave power to the antennas. The apparatus for power splitting is comprised of a waveguide and corresponding connecting couplers and cannot guarantee a uniform coupling of the microwave power to all of the antennas and thus the formation of a cylindrical symmetrical plasma cannot be ensured.

A direct inputting of microwave power from a rectangular waveguide into an annular resonator is disclosed in EP 0 398 832 A1. The dielectric inner wall of the resonator here simultaneously fulfills the function of a plasma chamber wall through which the microwave power is outputted to the plasma. The flat sides of the annular resonator are provided as shunt slides which enable adjustment of the optimum resonance conditions. However, since here the plasma chamber has the dielectric walls, the dimensions of a substrate to be treated in the chamber is limited. Furthermore, a complex and expensive mechanical arrangement is required for tuning of the resonator.

OBJECTS OF THE INVENTION

It is, therefore, the principal object of the present invention to provide an improved apparatus for generating a low-pressure and especially, a high-volume plasma which is free from the drawbacks of the earlier systems described and thus allows treatment of large volume articles in the plasma chamber.

Another object of the invention is to provide an apparatus for producing a large-volume low-pressure plasma which has a sufficiently high plasma density (up to several $10^{12}$ cm$^{-3}$) for practical treatment of large-volume and large-area workpieces but yet can avoid contamination during such treatment.

Still another object of the invention is to provide an apparatus in which a substantially uniform and symmetrical plasma can be generated and maintained for effective treatment of complex articles on all sides in the plasma chamber.

SUMMARY OF THE INVENTION

These objects and others which will become more readily apparent hereinafter are attained, in accordance with the invention in an apparatus for producing a low-pressure plasma which comprises:

- means forming a plasma chamber adapted to contain a low-pressure plasma;
- a circular ring-shaped waveguide resonator surrounding the plasma chamber and provided in an inner wall with a plurality of coupling slits spaced and oriented to effect substantially equal microwave power output coupling from the resonator to the chamber at all of the coupling slits;
- a microwave generator; and
- coupling means connecting the microwave generator with the waveguide resonator for input coupling of microwave energy from the microwave generator to the waveguide resonator.

The object to be treated can be inserted into the plasma in the plasma chamber and can be treated uniformly on all sides of the object.

According to a feature of the invention, the ring-shaped waveguide resonator is dimensioned to generate a standing wave therein and the coupling slits are spaced equidistantly from one another around the inner wall and around the standing wave. The inner wall is preferably cylindrical and the coupling slits can extend parallel to the generatrices of the inner wall.

Advantageously, among the array of coupling slits are coupling slits which are spaced apart by a distance equal to characteristic wavelengths of the waveguide forming the resonator and still more advantageously, so that successive coupling slits around the inner wall are spaced apart by half of the wave-length of the waveguide forming the resonator.

The standing wave is preferably a $TE_{10}$ wave in the waveguide resonator and the coupling slits thus output couple the energy of the standing $TE_{10}$ wave by a penetration of an azimuthal component of the magnetic field through the coupling slits. The coupling slits can have lengths equal to a half free-space wave-length.

According to another feature of the invention, the means for coupling can include a tuning unit between the microwave generator and the waveguide resonator and a capacitative or inductive coupler for feeding microwave energy from the tuning unit into the waveguide resonator. Instead of a capacitative or inductive coupler, an adjustable coupling pin can be provided for this purpose, the coupling pin being a screw or the like adjustable along its axis.

The plasma chamber can be separated from the inner wall of the ring-shaped waveguide resonator by a cylinder of a dielectric material selected from the group which consists of quartz glass and aluminum oxide ceramic.

The plasma chamber can be composed of metal and the coupling means can include a vacuum-tight window closing the chamber and composed of a dielectric material.

A magnetic coil can be provided on one side or with the magnetic coils disposed on opposite sides of the ring-shaped waveguide resonator for producing the electron-cyclotron-resonance zones and such zones can also be produced by an assembly of permanent magnets polarized perpendicular to a wall of the plasma chamber and disposed between the inner wall of the waveguide resonator and the plasma chamber wall for producing the electron-cyclotron-resonance zones.

A plurality of microwave generators can be coupled to the resonator at respective coupling locations and, conversely, a plurality of resonators can be provided and coupled to a common feed resonator.

BRIEF DESCRIPTION OF THE DRAWING

The above and other objects, features and advantages of the invention will become more readily apparent from the following description, reference being made to the accompanying highly diagrammatic drawing in which:

FIG. 1b is a section through an apparatus of FIG. 1a taken along line Ib—Ib of FIG. 1a;

SPECIFIC DESCRIPTION OF THE INVENTION

Figure 1A:
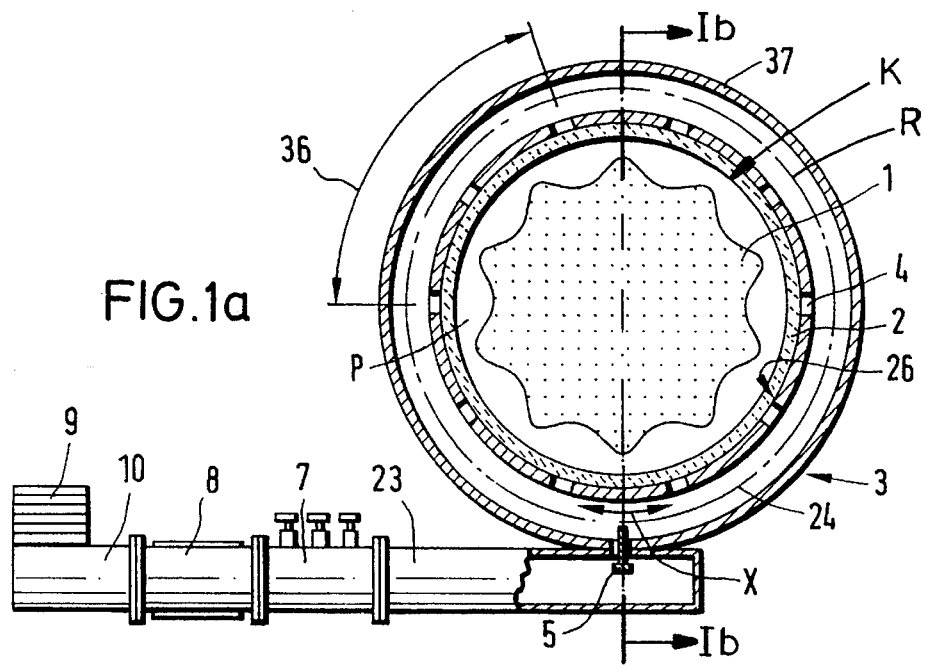
FIG. 1a is a section in a plane perpendicular to a longitudinal axis of the plasma chamber and showing an apparatus embodying the invention.
Figure 1B:
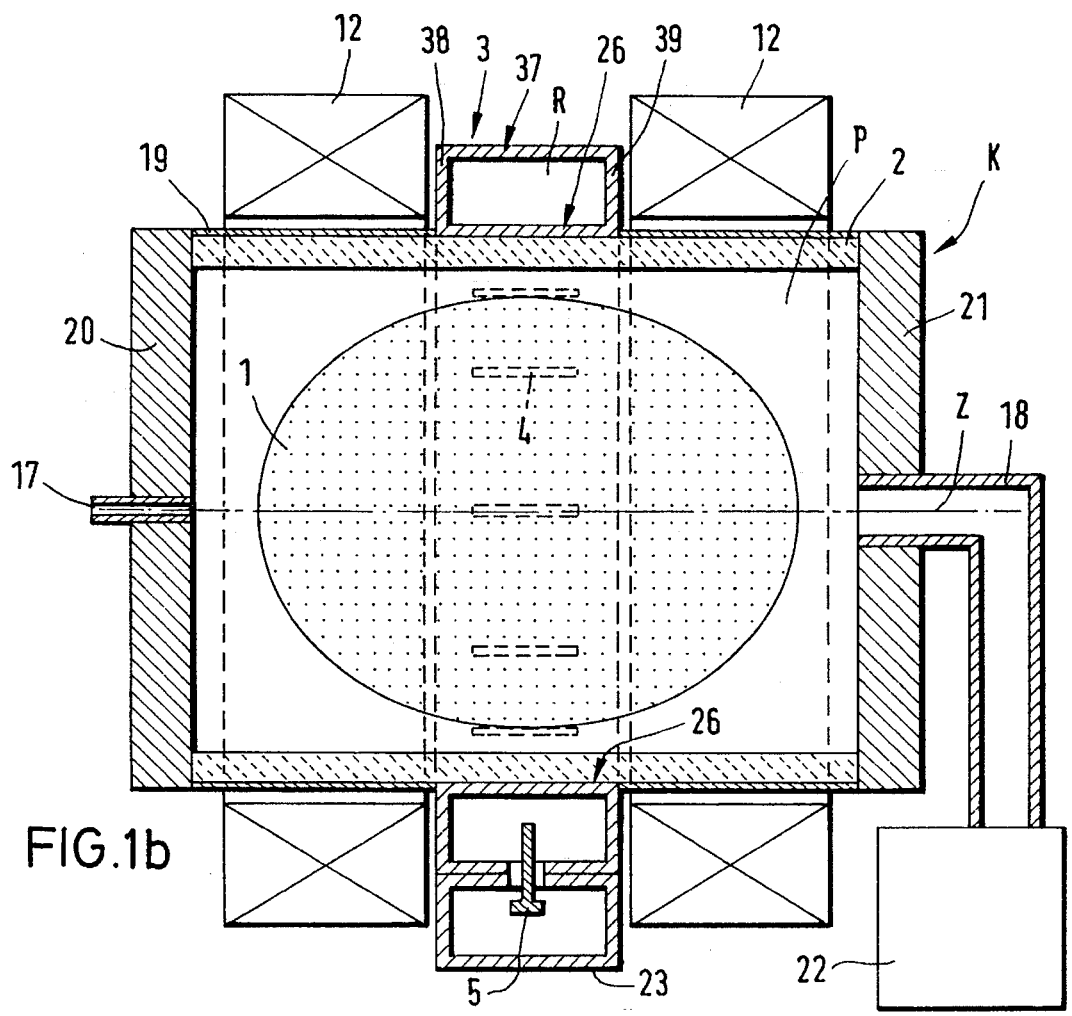

In FIGS. 1a and 1b, we have shown an embodiment of the invention in which a vacuum or plasma chamber K is comprised of a quartz cylinder 2 and has two connecting flanges 20 and 21 (see FIG. 1b) which serve for connection to a vacuum pump 22 via the fitting 18 (see FIG. 1b) so that the pressure in the plasma chamber can be drawn down to a residual pressure, i.e. the low pressure of a plasma.

In the flange 20, a gas inlet fitting 17, as seen in FIG. 1b is provided for admitting the working gas which is to be transformed into the plasma. In the case of the treatment of wafers, that working gas can include a reactive component, such as oxygen.

Between the vacuum pump and the supply of gas, a pressure between $10^{-5}$ and 100 mbar can be generated within the chamber.

The apparatus utilizes a magnetron vacuum tube 9 (see FIG. 1a) to generate the microwaves at a frequency sufficient to excite the gas within the plasma chamber and produce the plasma. In a typical case that frequency is 2.45 GHz. The microwaves are coupled to the resonator via a coupling unit from the microwave generator 9 which can include a waveguide 10 (see FIG. 1a).

The coupling means also can include a circulator 8 (FIG. 1a) which is provided upstream from a three-pin tuner 7 and connected therewith to the waveguide 10 (see FIG. 1a). Downstream of the tuning unit 7, 8 is a rectangular waveguide 23 which may be connected by a capacitative, inductive or pin-type coupler 5 with a ring-shaped waveguide resonator 3 as is clearly visible from FIGS. 1a and 1b.

The diameter of the ring-shaped waveguide resonator 3 which has an annular space R (FIGS. 1b and 3) is so chosen that within this annular space a standing $TE_{10}$ microwave is formed.

The metallic circular annular waveguide resonator 3 has an outer cylindrical wall 37, an inner cylindrical wall 26 and planar annular or ring-shaped walls 38 and 39 (see FIG. 1b) connected to the inner and outer walls, all of these walls being circular. In the illustrated embodiment, the center of the annular chamber R, represented by the dot-dash circle 24 in FIG. 1a has a circumferential length corresponding to five wave-lengths 36 (see FIG. 2) in the case in which the annular waveguide resonator 3 is filled with air under normal pressure.

Figure 2:
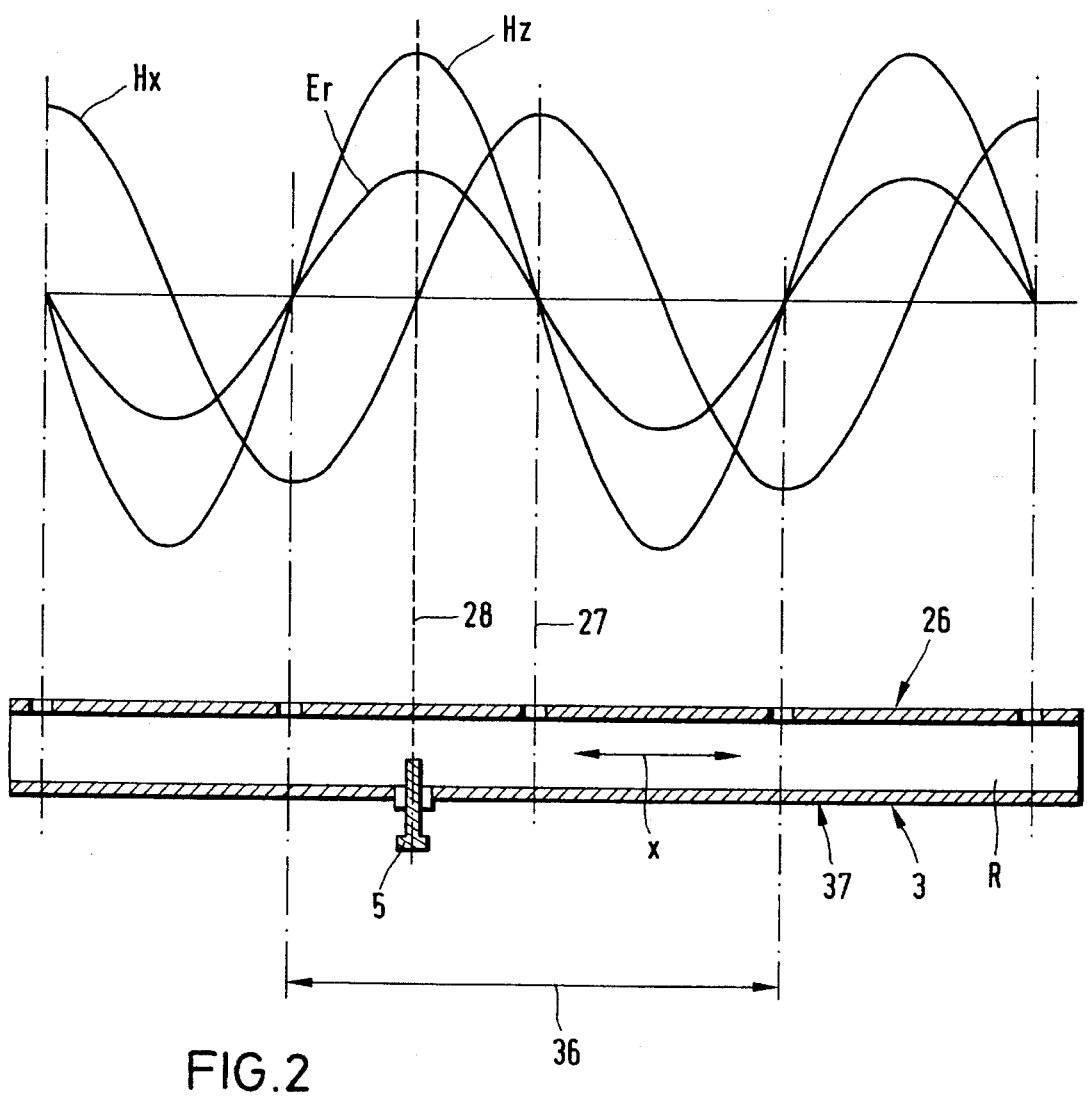
FIG. 2 is a waveform diagram correlated with a developed view of the ring-shaped waveguide resonator, illustrating principles of the invention.
Figure 3:
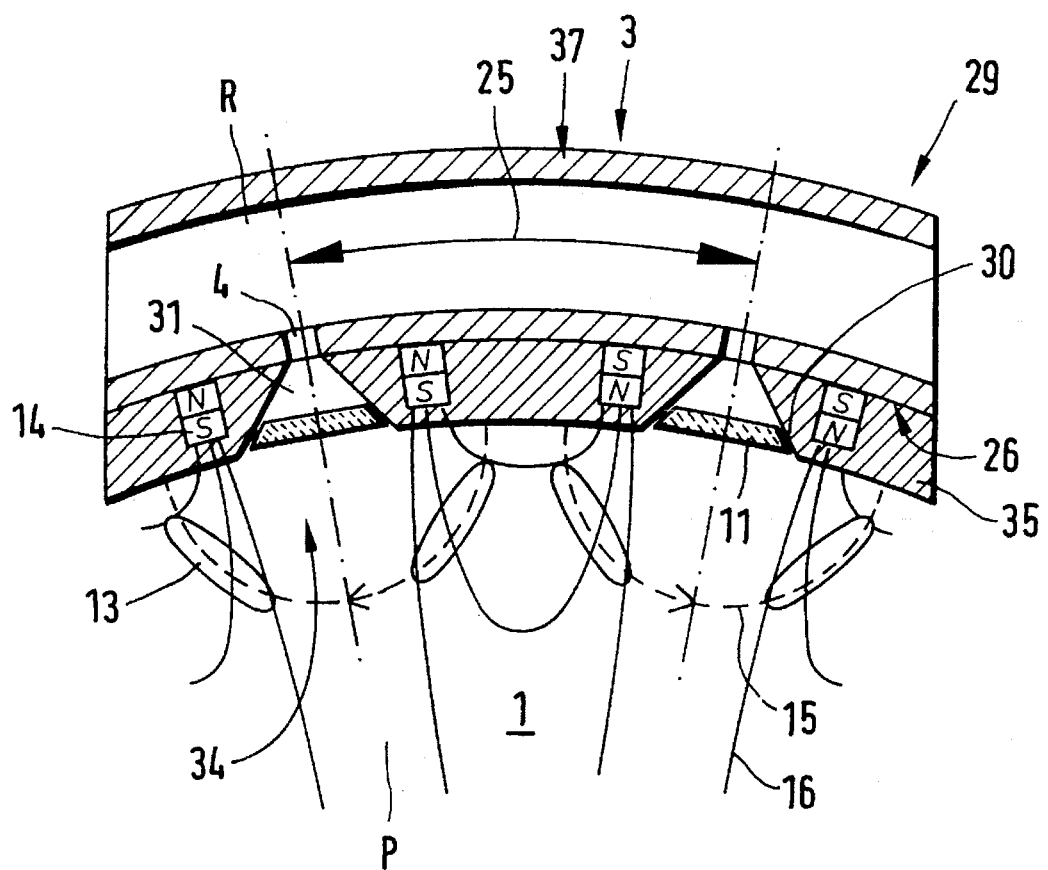
FIG. 3 is a detail section of a coupling region where the process chamber is composed of metal.

In the inner wall 26 of the ring-shaped waveguide resonator 3 (FIG. 2), there are a multiplicity of coupling slits 4 which are equidistant from one another with a spacing of a half of the wavelength 25 of the waveguide (half of the characteristic waveguide wavelength), see FIG. 3, with respect to the circle 24 in the center of the ring-shaped waveguide resonator and parallel to the direction x (see FIG. 1a and FIG. 2) of the wavespread.

The coupling slits 4 extend in the direction of or are parallel to the generatrices of the circularly cylindrical inner wall and the lengths of the coupling slits 4 can each amount to a half of the free space wavelength.

Since the, e.g. capacitative, coupler 5 (FIG. 2) lies precisely in the middle between two coupling slits, the standing wave in the annular space R (FIG. 2) of the waveguide resonator 3, is so formed that, at the coupling slits 4, the azimuthal component of the high-frequency H field Hx has its maximums 27 and the z component of the H field $H_z$ and the radial component of the E field Er, their minima 28 (see FIG. 2).

As a result, the output coupling of the microwave power is effected by the penetration of the azimuthal component of the H field Hx through the coupling slits 4 into the interior plasma space.

The microwaves injected into the circular waveguide resonator 3 (having outer wall 37) as seen in FIG. 2 and by this resonator into the plasma space ignite the plasma to generate an externally intensive low-pressure plasma 1 in the space P surrounded by the inner wall 26 (FIG. 2) of the ring-shaped waveguide resonator 3. The space P is also circular in a cross sectional plane perpendicular to its axis corresponding to the dot-dash line z in FIG. 1b.

At least alternate ones of the coupling slits 4 have equispacing around the inner wall 26 which is equal to a full characteristic wave-length of the waveguide resonator as represented at 36 (FIG. 2). To prevent the escape of microwaves from the plasma chamber outwardly, the quartz cylinder 2 is surrounded by an electrically conductive shield 19 (see FIG. 1b).

In practice we can obtain an ion concentration of $10^{11}$ to $10^{12}$ cm$^{-3}$ in a pressure range of 0.1 to 10 mbar of the plasma. A dense plasma at low pressures (below $10^{-3}$ mbar) can also be generated. By ensuring an electron-cyclotron-resonance, the charge intensity can be significantly increased. In that case, a magnet coil 12 can be provided on one side of the resonator or on both sides of the resonator (FIG. 1b) or these zones 13 can be confined by permanent magnets 14 as shown in FIG. 3.

The embodiment wherein the cylinder 2 is composed of quartz glass or aluminum oxide does not allow very large plasma chamber diameters to be utilized, above say about several decimeters, because then the quartz wall 2 must be very thick. A practically unlimited upscaling can be obtained in the dimensions of the plasma chamber when the entire chamber is not lined with the dielectric but dielectric windows are provided. In that case, much larger plasma chambers K can be provided.

As can be seen from FIG. 3, which illustrates a segment 29 (having an inner wall 26 and an outer wall 37) utilizing the latter principles, and providing a different output coupling of the resonator to the plasma 1, permanent magnets 14 (with poles N,S) are so positioned in the metallic plasma chamber wall 35 (e.g. of copper) that the lines of the high-frequency electric field 15 cross the lines of the static magnetic field 16. With such an arrangement, an optimal transfer of the microwave oscillation to the electrons accelerated in a spiral trajectory in the plasma is ensured.

The windows 11 between the slits 4 and the plasma space P can be composed of 99.7% $Al_2O_3$ ceramic or quartz glass and can be sealed with a soft metal seal 30 in a vacuum-tight manner.

The space between the window 11 and each slit 4 is formed as a short rectangular horn radiator 31. The assembly formed by the coupling slits 4, the horn radiators 31 and the coupling windows 11 of dielectric material, form slit couplers 34 (FIG. 4) within the definition of the invention.

It should be noted that other vacuum seals and systems for fastening the permanent magnets in place can allow the metallic wall 35 to be substantially thinner.

The apparatus of the invention can thus utilize the comparatively large diameter of the plasma chamber to permit treatment of relatively large objects from all sides with the plasma. The length of the plasma generating region and not only the diameter can also play an important role in some cases. For example, when a long plasma chamber is used, an embodiment like that of FIG. 4 can be used with three ring-shaped waveguide resonators 3 (with inner walls 26, outer walls 37 and resonating annular spaces R) which are connected to a common feed resonator 32 utilizing axially adjustable coupling pins 33, e.g. screws, to ensure equal injection of microwave energy at all three resonators. As is described hereabove with reference to FIG. 1 each of the resonators is formed with planar annular walls 38, 39 bridging respective inner and outer cylindrical walls 26, 37 as seen in FIG. 4.

To achieve a coherent microwave coupling, the adjustable coupling pins 33 are spaced from one another by a by a spacing 25 (FIG. 4) corresponding to a waveguide wavelength 36 (FIG.2).

Figure 4:
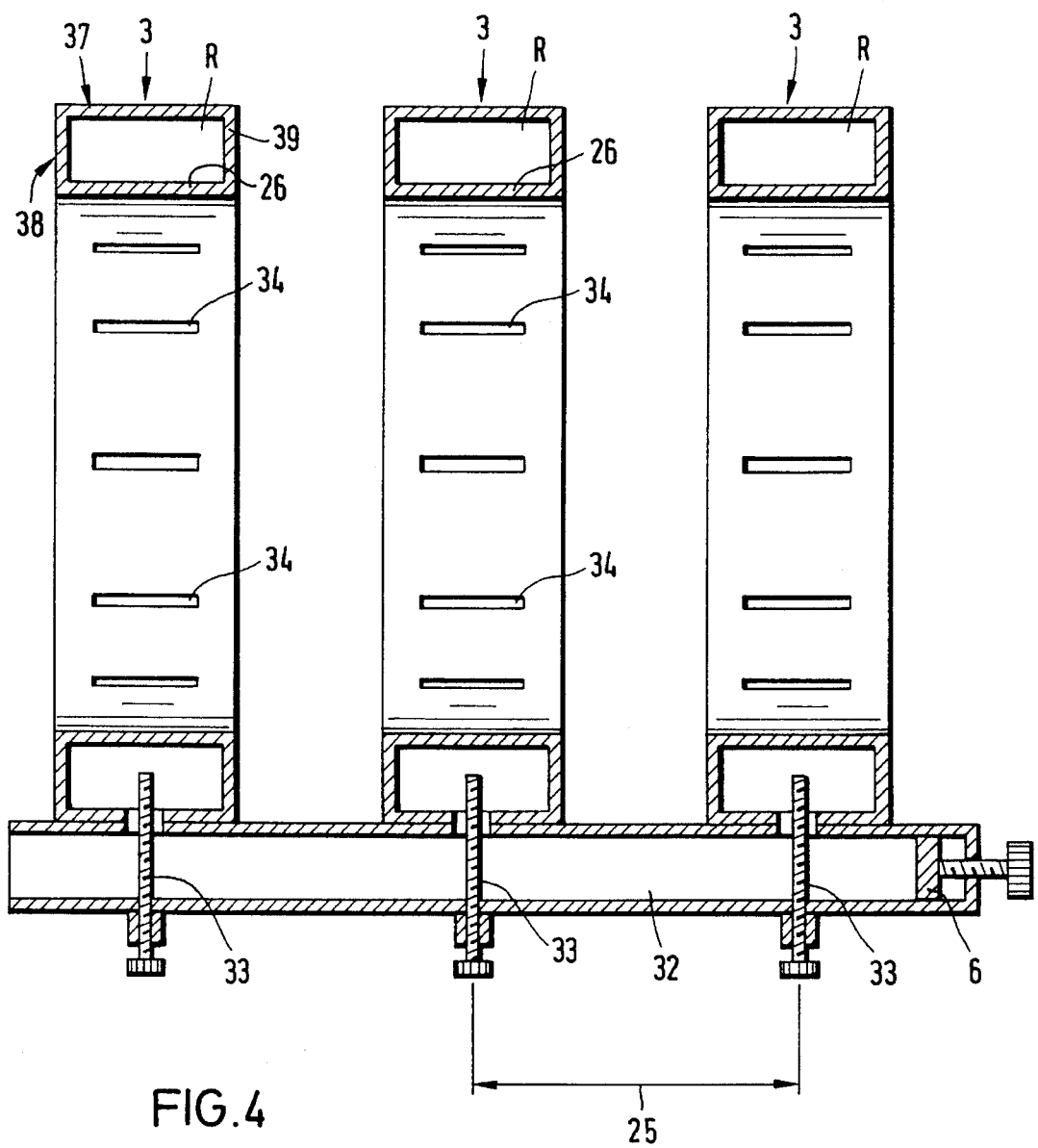
FIG. 4 is a section illustrating a plurality of ring-shaped waveguide resonators coupled to a single feed waveguide.

For the optimum establishment of a standing wave in the rectangular feed resonator 32, a short-circuit slide 6 is provided at one side of the feed resonator 32 (see FIG. 4).

We claim:

1. An apparatus for producing a low-pressure plasma, comprising:

a plasma chamber adapted to contain a low-pressure plasma;

at least one circular ring-shaped waveguide resonator surrounding said plasma chamber and provided in an inner wall thereof with a plurality of coupling slits spaced and oriented to effect substantially equal microwave power output coupling from said at least one resonator to said chamber at all of said coupling slits;

at least one microwave generator; and coupling means connecting said at least one microwave generator with corresponding said at least one waveguide resonator for input coupling of microwave energy from said at least one microwave generator to said at least one waveguide resonator, said at least one ring-shaped waveguide resonator having respective dimensions which are sufficient to generate a TE10 standing wave with a magnetic field having an azimuthal component therein in response to microwave energy coupled to said at least one waveguide resonator from said at least one microwave generator, said coupling slits being spaced equidistantly from one another around said inner wall of said at least one circular resonator and around said standing wave, said inner wall being cylindrical and said coupling slits are parallel to generatrices of the inner wall and are spaced apart by a distance equal to a wavelength of the microwave energy coupled into said at least one waveguide resonator, and the coupling slits output couple the energy of the standing TE10 wave by the penetration of the azimuthal component of a magnetic field through the coupling slits into the plasma chamber.

2. The apparatus defined in claim 1 wherein said at least one ring-shaped waveguide resonators comprises a plurality of ring-shaped waveguide resonators which are provided and are respectively fed by coherently driven microwave generators.

3. The apparatus defined in claim 1 wherein said at least one ring-shaped waveguide resonator comprises a plurality of ring-shaped waveguide resonators which are provided and are coupled together by a common feed resonator, all of the ring-shaped resonators receiving the same power.

4. The apparatus defined in claim 1 wherein said at least one microwave generator is one of a plurality of microwave generators are coupled to said at least one ring-shaped waveguide resonator at respective coupling locations.

5. The apparatus defined in claim 1 wherein said at least one ring-shaped waveguide resonator has opposing sides, and said apparatus further comprises two magnetic coils, one on each side of said at least one ring-shaped waveguide resonator, for generating an electron-cyclotron-resonance zone in said plasma.

6. The apparatus defined in claim 1 wherein said coupling slits each have lengths each equal to a half free-space wavelength.

7. The apparatus defined in claim 1 wherein said means for coupling includes a respective tuning unit between said at least one microwave generator and corresponding said at least one waveguide resonator and a respective capacitive coupler for feeding microwave energy from said tuning unit into said at least one waveguide resonator.

8. The apparatus defined in claim 1 wherein said means for coupling includes a respective tuning unit between said at least one microwave generator and corresponding said at least one waveguide resonator and an respective inductive coupler for feeding microwave energy from said tuning unit into said at least one waveguide resonator.

9. The apparatus defined in claim 1 wherein said means for coupling includes a respective tuning unit between said at east one microwave generator and corresponding said at least one waveguide resonator and a respective adjustable coupling pin for feeding microwave energy from said respective tuning unit into said at least one waveguide resonator.

10. The apparatus defined in claim 9 wherein said respective coupling pin has an axis and is adjustable along the axis of the coupling pin.

11. The apparatus defined in claim 1 wherein said plasma chamber is separated from the respective inner wall of said at least one ring-shaped waveguide resonator by a cylinder of a dielectric material.

12. The apparatus defined in claim 11 wherein said cylinder of a dielectric material is composed of quartz glass or an aluminum-oxide ceramic.

13. The apparatus defined in claim 1 wherein said plasma chamber is composed of metal and said coupling means includes a vacuum-tight window closing said chamber and said window being composed of a dielectric material.

14. The apparatus defined in claim 1 wherein said at least one ring-shaped waveguide resonator has opposing sides, and said apparatus further comprises two magnetic coils on one side of the at least one ring-shaped waveguide resonator for generating an electron-cyclotron-resonance zone in said plasma.

15. The apparatus defined in claim 1 wherein said plasma chamber has a cylindrical wall surrounded by the respective inner wall of the ring-shaped waveguide resonator, and said apparatus further comprises an assembly of permanent magnets polarized perpendicular to said wall of said plasma chamber and located between the respective inner wall of the at least one ring-shaped waveguide resonator and the plasma chamber wall for producing an electron-cyclotron-resonance zone in said plasma.

16. The apparatus defined in claim 15 wherein at each of said coupling slits, two like polarized permanent magnets of said assembly are provided, the magnets of successive slits along said inner wall being polarized oppositely to one another.

17. An apparatus for producing a low-pressure plasma, comprising:

a plasma chamber adapted to contain a low-pressure plasma;

a circular ring-shaped waveguide resonator surrounding said plasma chamber and provided in an inner wall thereof with a plurality of coupling slits spaced and oriented to effect substantially equal microwave power output coupling from said resonator to said chamber at all of said coupling slits;

a microwave generator; and coupling means connecting said microwave generator with said waveguide resonator for input coupling of microwave energy from said microwave generator to said waveguide resonator, said ring-shaped waveguide resonator having dimensions which are sufficient to generate a TE10 standing wave with a magnetic field having an azimuthal component therein in response to microwave energy coupled to said waveguide resonator from said microwave generator, said coupling slits being spaced equidistantly from one another around said inner wall and around said standing wave, said inner wall being cylindrical and said coupling slits are parallel to generatrices of the inner wall, and the coupling slits output couple the energy of the standing TE10 wave by the penetration of the azimuthal component of a magnetic field through the coupling slits, into the plasma chamber.

18. The apparatus defined in claim 17 wherein successive coupling slits around said inner wall are spaced apart by a half wavelength of the microwave energy coupled into said waveguide resonator.

* * * * *